US008456559B2

(12) United States Patent
Yamashita et al.

(10) Patent No.: US 8,456,559 B2
(45) Date of Patent: Jun. 4, 2013

(54) SOLID-STATE IMAGING APPARATUS AND DRIVING METHOD THEREOF

(75) Inventors: Yuichiro Yamashita, Ebina (JP); Masahiro Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 488 days.

(21) Appl. No.: 12/918,685

(22) PCT Filed: Apr. 3, 2009

(86) PCT No.: PCT/JP2009/057303
§ 371 (c)(1),
(2), (4) Date: Aug. 20, 2010

(87) PCT Pub. No.: WO2009/125821
PCT Pub. Date: Oct. 15, 2009

(65) Prior Publication Data
US 2010/0328302 A1 Dec. 30, 2010

(30) Foreign Application Priority Data

Apr. 9, 2008 (JP) .................... 2008-101531

(51) Int. Cl.
*H04N 3/14* (2006.01)
*H04N 5/335* (2006.01)
*H01L 27/00* (2006.01)
*H01L 31/062* (2006.01)
*H01L 31/113* (2006.01)

(52) U.S. Cl.
USPC .............. 348/308; 250/208.1; 257/291

(58) Field of Classification Search
USPC .......... 348/308, 243, 246, 296, 302; 257/291, 257/290, 292, 222, 223, 225, 229, 230, 231, 257/233, 445, 446, 463
See application file for complete search history.

(56) References Cited

U.S. PATENT DOCUMENTS

| 7,271,835 B2 | 9/2007 | Iizuka et al. | |
| 7,462,810 B2 | 12/2008 | Kobayashi et al. | 250/208.1 |
| 7,623,056 B2 | 11/2009 | Yamashita | 341/163 |
| 7,633,539 B2 | 12/2009 | Yamashita | 348/294 |
| 7,733,401 B2 * | 6/2010 | Takeda | 348/308 |
| 7,800,675 B2 * | 9/2010 | Shah | 348/308 |

(Continued)

FOREIGN PATENT DOCUMENTS

| JP | 2001-245216 A | 9/2001 |
| JP | 2004-111590 A | 4/2004 |
| KR | 10-2008-0011681 A | 2/2008 |

OTHER PUBLICATIONS

Korean Office Action dated Jan. 13, 2012, in related Korean Application No. 10-2010-7024552.

*Primary Examiner* — John Villecco
(74) *Attorney, Agent, or Firm* — Fitzpatrick, Cella, Harper & Scinto (57) ABSTRACT

A solid-state imaging apparatus includes the carrier holding portion and the amplifying portion in each pixel, wherein a first voltage supplied to a transfer electrode when the transfer portion for transferring carriers from the carrier holding portion to the amplifying portion is placed in a non-conducting state is opposite in polarity to a voltage supplied to the transfer electrode during the turning on period of the transfer portion, and a second voltage supplied to the control electrode of the carrier holding portion during a holding period in which the carriers are retained in the carrier holding portion is the same in polarity as the first voltage and is larger in absolute value than the first voltage.

8 Claims, 8 Drawing Sheets

U.S. PATENT DOCUMENTS

| | | | |
|---|---|---|---|
| 7,817,199 B2 | 10/2010 | Yamashita et al. | 348/308 |
| 7,851,798 B2 | 12/2010 | Ladd | |
| 8,021,908 B2 | 9/2011 | Ladd | |
| 8,184,188 B2 * | 5/2012 | Yaghmai | 348/308 |
| 8,284,282 B2 * | 10/2012 | Oike | 348/294 |
| 8,334,498 B2 * | 12/2012 | Kanbe | 250/214.1 |
| 2001/0030701 A1 | 10/2001 | Hiyama et al. | 348/304 |
| 2004/0051801 A1 | 3/2004 | Iizuka et al. | 348/294 |
| 2006/0044437 A1 * | 3/2006 | Shah | 348/308 |
| 2006/0180741 A1 | 8/2006 | Agranov et al. | 250/208.1 |
| 2006/0249731 A1 * | 11/2006 | Ladd | 257/59 |
| 2006/0266922 A1 * | 11/2006 | McGrath et al. | 250/208.1 |
| 2006/0284054 A1 | 12/2006 | Asaba | 250/214.1 |
| 2007/0272828 A1 * | 11/2007 | Xu | 250/208.1 |
| 2008/0029787 A1 | 2/2008 | Watanabe et al. | 257/233 |
| 2009/0134437 A1 | 5/2009 | Nakashima et al. | 257/292 |
| 2009/0135284 A1 * | 5/2009 | Altice et al. | 348/308 |
| 2009/0219418 A1 * | 9/2009 | Fujita | 348/243 |
| 2009/0244328 A1 | 10/2009 | Yamashita | 348/241 |
| 2009/0256176 A1 | 10/2009 | Kobayashi et al. | 257/225 |
| 2009/0284632 A1 | 11/2009 | Onuki et al. | 348/302 |
| 2009/0303364 A1 | 12/2009 | Shibata et al. | 348/302 |
| 2009/0316032 A1 * | 12/2009 | Misawa et al. | 348/308 |
| 2010/0053398 A1 | 3/2010 | Yamashita | 348/302 |
| 2010/0165167 A1 * | 7/2010 | Sugiyama et al. | 348/311 |
| 2011/0007196 A1 * | 1/2011 | Yamashita et al. | 348/294 |
| 2011/0013062 A1 * | 1/2011 | Yamashita | 348/294 |
| 2011/0013067 A1 * | 1/2011 | Yamashita | 348/308 |
| 2011/0031543 A1 * | 2/2011 | Kawahito | 257/292 |
| 2011/0032379 A1 * | 2/2011 | Kobayashi et al. | 348/222.1 |
| 2011/0084316 A1 * | 4/2011 | Yamashita et al. | 257/226 |
| 2011/0114826 A1 * | 5/2011 | Ladd | 250/214 P |
| 2011/0242378 A1 * | 10/2011 | Mabuchi | 348/296 |
| 2011/0297816 A1 * | 12/2011 | Ladd | 250/214.1 |
| 2012/0153125 A1 * | 6/2012 | Oike et al. | 250/208.1 |

* cited by examiner

SOLID-STATE IMAGING APPARATUS AND DRIVING METHOD THEREOF

TECHNICAL FIELD

The present invention relates to a solid-state imaging apparatus and, more particularly, to a solid-state imaging apparatus in which a carrier holding portion, which enables electronic shutter operation, is provided in a pixel.

BACKGROUND ART

Conventionally, there is known a solid-state imaging apparatus in which the carriers of a photoelectric conversion element are transferred by a transfer MOS transistor to a floating diffusion region, converted to a voltage, and then read out. In such a solid-state imaging apparatus as described above, electrons from the channel portion of the transfer MOS transistor flow into the photoelectric conversion element in some cases during an accumulating period at the photoelectric conversion element, thus changing into a dark current. On the other hand, Japanese Patent Application Laid-Open No. 2001-245216 (hereinafter referred to as Patent Document 1) discloses a configuration in which a dark current is suppressed by setting a signal level applied to the control electrode of a transfer MOS transistor in an off state lower than a signal level applied to the control electrode of another MOS transistor in an off state.

In addition, Japanese Patent Application Laid-Open No. 2004-111590 (hereinafter referred to as Patent Document 2) discloses a configuration in which a carrier accumulating portion arranged in association with each photoelectric conversion element is provided in a pixel, thereby performing electronic shutter operation. A storage pulse is input to the gate electrode of the carrier accumulating portion. As this storage pulse, an active pulse is supplied immediately before an accumulating period or an inactive pulse is supplied during the accumulating period. After that, the carrier accumulating portion is cleared for all pixels at a time before the signal carriers of each photoelectric conversion element are transferred to the carrier accumulating portion. Specifically, a readout selection transistor is turned on at the end of an accumulating period at the photoelectric conversion element before a frame shift pulse (storage pulse) is activated. Thus, unnecessary carriers accumulated in the carrier accumulating portion are transferred to a floating diffusion region to reset the photoelectric conversion element.

In Patent Document 2, satisfactory consideration has not been given to the amplitude of a pulse to be input to the gate electrode of the carrier accumulating portion, particularly to a voltage to be supplied during an accumulating period.

In addition, there is the possibility that a dark current also mixes into the carrier accumulating portion during the carrier-holding period of the carrier accumulating portion. The dark current is generated at a boundary between a carrier-accumulating semiconductor region of the carrier accumulating portion and a surface oxide film, and mixes into carriers retained in the carrier holding portion. This problem has a particularly significant influence if the impurity concentration of the semiconductor region of the carrier holding portion is increased to a certain degree, in order to increase the amount of carriers retained in the carrier holding portion. In addition, as described in Patent Document 1, it is important to suppress a dark current in a channel portion underneath a transfer electrode. Conventionally, no consideration has been given, however, to a relationship between a voltage supplied during the non-conducting period of a transfer portion and a voltage supplied to the gate electrode of the carrier holding portion during the accumulating period of the carrier holding portion. Maintaining the withstand voltage of a MOS transistor is a critical issue particularly when operating the solid-state imaging apparatus at a low voltage.

In view of the above-described problems, it is an object of the present invention to achieve both the reduction of a dark current mixing into a carrier holding portion and the maintenance of the withstand voltage of a transfer portion.

DISCLOSURE OF THE INVENTION

In view of the foregoing, the present invention is directed to a driving method of a solid-state imaging apparatus including a plurality of pixels, each including:

a photoelectric conversion portion;

a carrier holding portion including a semiconductor region capable of accumulating signal carriers generated in the photoelectric conversion portion, and a control electrode arranged above the semiconductor region sandwiching an insulating film between the semiconductor region and the control electrode, such that the carrier holding portion holds the signal carriers generated in the photoelectric conversion portion;

an amplifying portion; and a transfer portion having a transfer electrode for controlling an electrical connection between an input portion of the amplifying portion and the carrier holding portion, wherein the driving method including the steps of:

supplying the transfer electrode with a first voltage for turning off the electrical connection through the transfer portion, the first voltage being in a polarity opposite to a polarity of a voltage supplied to the transfer electrode during the turning on period of the transfer portion; and supplying the control electrode with a second voltage during a period of holding the carrier by the carrier holding portion, the second voltage being in the same polarity as the first voltage and being larger than the first voltage.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

BEST MODES FOR CARRYING OUT THE INVENTION

Figure 1:
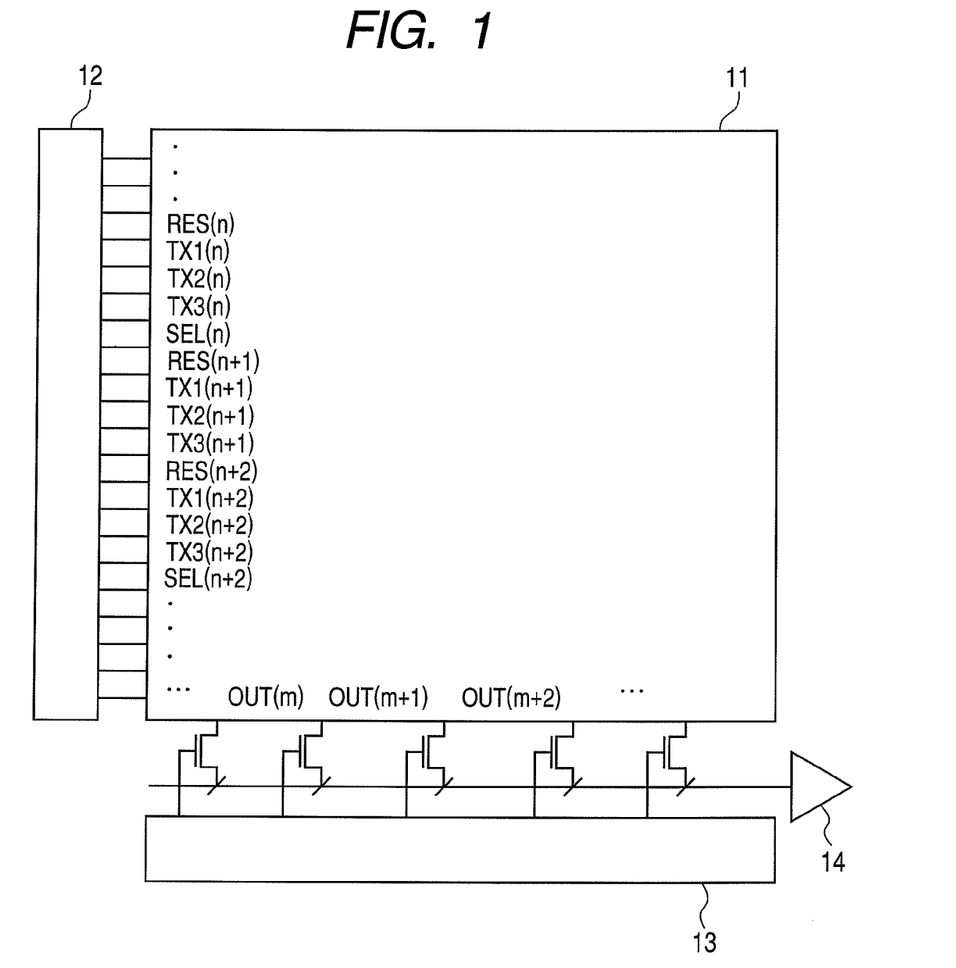
FIG. 1 is one example of an overall view of a solid-state imaging apparatus.

FIG. 1 is a schematic block diagram of a solid-state imaging apparatus and includes an imaging region 11 in which a plurality of pixels is arranged in a matrix-like manner, a vertical scanning circuit 12, and a horizontal scanning circuit 13. The vertical scanning circuit 12 constitutes a later-described voltage supply portion along with a non-illustrated power supply portion. The horizontal scanning circuit 13 sequentially scans signal lines provided in association with rows of pixels in the imaging region and outputs signals from one line of pixels out of an output circuit 14.

Figure 2:
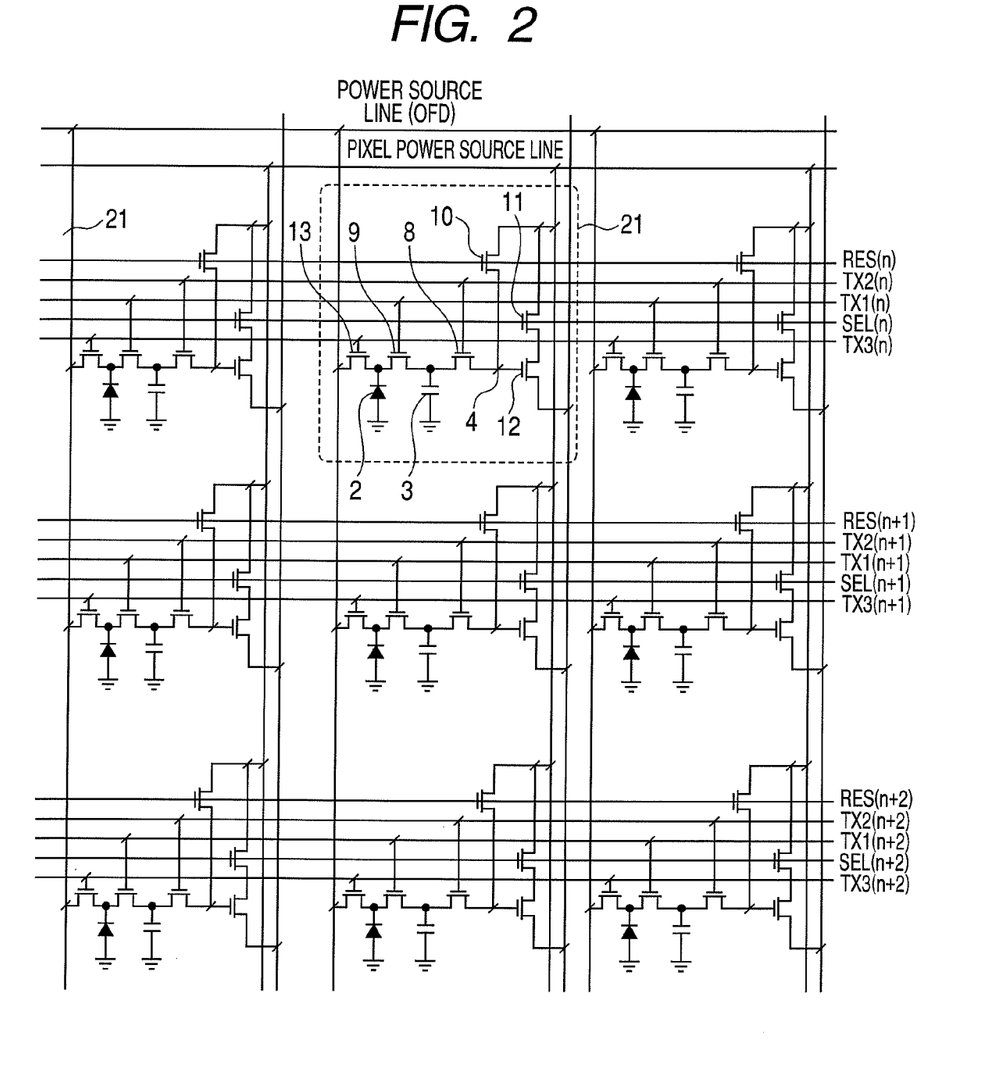
FIG. 2 is one example of an equivalent circuit diagram of the solid-state imaging apparatus.

FIG. 2 is an equivalent circuit diagram of pixels included in an imaging region 101. Although a case is taken as an example for simplicity of description in which the imaging region 101 includes a total of nine pixels arranged as 3 rows×3 columns, the number of pixels is not limited to this case.

A photoelectric conversion portion 2 generates signal carriers. A carrier holding portion 3 retains the signal carriers generated in the photoelectric conversion portion. An amplifying portion has an input portion 4. A first transfer portion 8 transfers the carriers of the carrier holding portion to the input portion of the amplifying portion. A second transfer portion 9 is provided as necessary. The second transfer portion 9 transfers the carriers of the photoelectric conversion portion to the carrier holding portion. A reset portion 10 supplies a reference voltage to at least the input portion of the amplifying portion. The reset portion 10 may further supply the reference voltage to the carrier holding portion. A selection portion 11 is provided as necessary, in order to output signals of each line of pixels to the signal lines. An amplifying portion 12 constitutes a source-follower circuit in conjunction with a constant current source provided in each signal line. A carrier discharge controlling portion 13 controls a connection between the photoelectric conversion portion and a power source line functioning as an overflow drain (hereinafter referred to as the OFD).

The configurations of FIGS. 1 and 2 can be commonly applied to embodiments to be described hereinafter. In addition, the equivalent circuit is not limited to these embodiments, but part of each configuration may be shared by a plurality of pixels. Furthermore, the equivalent circuit can also be applied to a configuration in which the control interconnect of each element is fixed at a certain voltage and no turning on control is performed.

(First Embodiment)

Figure 3:
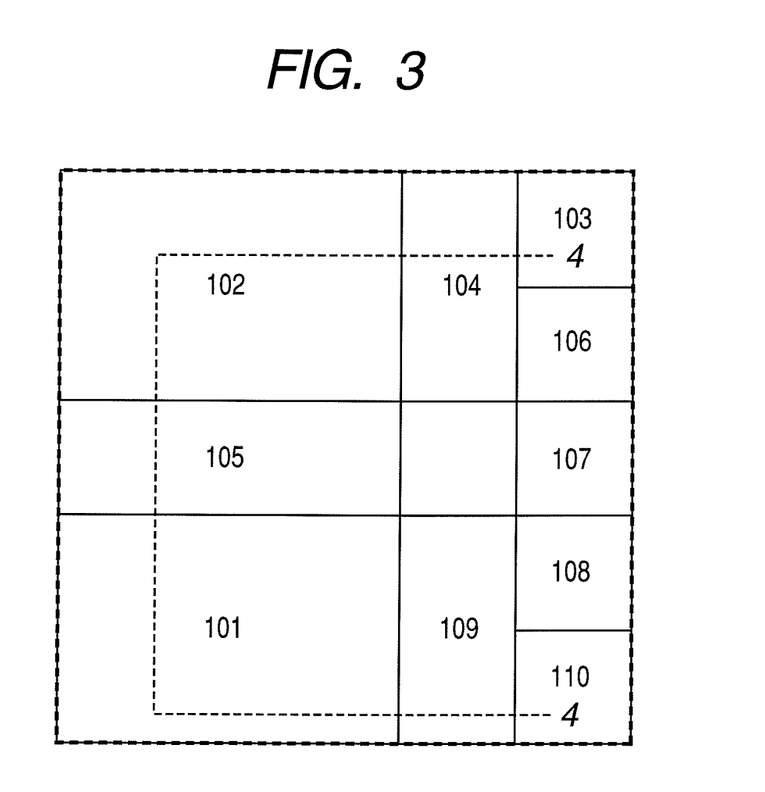
FIG. 3 is a plan view of a solid-state imaging apparatus according to a first embodiment.

FIG. 3 is a plan view illustrating a solid-state imaging apparatus of the present embodiment. Although each region is illustrated as a rectangular shape for convenience of description, this does not mean that the structure of each region is rectangular. Rather, the figure shows that respective structures are at least arranged in these regions. The same applies to other embodiments.

For a photoelectric conversion portion 101, it is possible to use, for example, a photodiode. Incident light causes the generation of pairs of a signal carrier and a carrier opposite in polarity to the signal carrier.

A carrier holding portion 102 is configured to be able to retain signal carriers generated in the photoelectric conversion portion. The carrier holding portion 102 includes a semiconductor region for accumulating signal carriers and a control electrode arranged over this semiconductor region through an insulating film.

A charge-to-voltage converting portion 103 includes, for example, a floating diffusion region (FD region) disposed in a semiconductor substrate.

A first transfer portion 104 can control the potential state of a first path (first channel) between the carrier holding portion and the charge-to-voltage converting portion. The potential referred to here is one as against a signal carrier. With the first transfer portion, it is possible to control the amount of signal carriers to be transferred from the carrier holding portion to the charge-to-voltage converting portion. The first transfer portion can be formed of polysilicon disposed on the first path through an insulating film.

A second transfer portion 105 can control the potential state of a second path between the photoelectric conversion portion and the carrier holding portion. With the second transfer portion, it is possible to control the amount of signal carriers to be transferred from the photoelectric conversion portion to the carrier holding portion. The second transfer portion can be formed of polysilicon disposed on the second path through an insulating film.

For a reset portion 106, it is possible to use, for example, a MOS transistor (resetting MOS transistor) to the drain of which a reset voltage is supplied. The reset portion 106 can discharge the carriers of the carrier accumulating portion 102 and the charge-to-voltage converting portion 103.

For an amplifying portion 107, it is possible to use, for example, a MOS transistor (amplifying MOS transistor). The amplifying MOS transistor constitutes a source-follower circuit in conjunction with a non-illustrated constant current source. The gate of the amplifying MOS transistor is connected to the charge-to-voltage converting portion 103. The gate of the amplifying MOS transistor and the charge-to-voltage converting portion 103 function as the input portion of the amplifying portion.

A selection portion 108 controls signal output to an unillustrated vertical output line. The selection portion 108 can be constituted using a MOS transistor (selecting MOS transistor).

A carrier discharge controlling portion 109 is used to discharge the carriers of the photoelectric conversion portion to a later-described overflow drain (OFD) region. The carrier discharge controlling portion 109 controls the potential state of a path between the photoelectric conversion portion and the OFD region. The carrier discharge controlling portion 109 can be formed of polysilicon disposed on the path through an insulating film. An OFD region 110 is a semiconductor region to which a power supply voltage is supplied.

Figure 4:
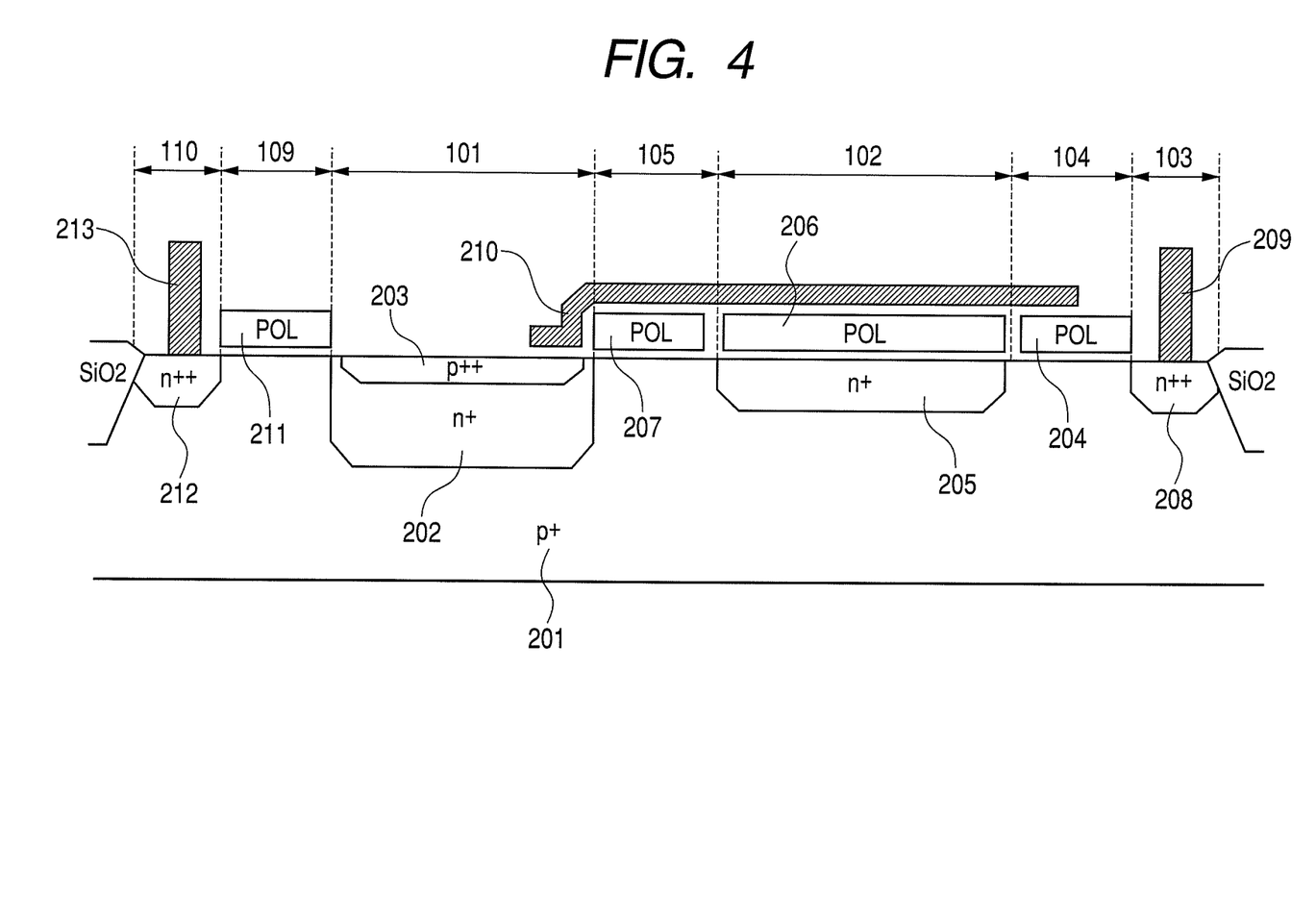
FIG. 4 is a cross-sectional view taken along the line 4-4 in FIG. 3.

FIG. 4 is a cross-sectional view taken along the line 4-4 in FIG. 3. Constituent elements corresponding to those of FIG. 3 are denoted by like reference numerals. Hereinafter, a description will be made of a case in which the conductivity type of the semiconductor region is assumed to be such that electrons are used as signal carriers. If holes are used instead, the conductivity type of each semiconductor region may be changed to an opposite conductivity type.

A P-type semiconductor region 201 may be formed by implanting P-type impurity ions into an N-type semiconductor substrate, or may be formed using a P-type semiconductor substrate.

An N-type semiconductor region (first semiconductor region of first conductivity type) 202 constitutes part of the photoelectric conversion portion. The N-type semiconductor region 202 is the same in polarity as electrons serving as signal carriers. The N-type semiconductor region 202 forms a PN junction in conjunction with part of the P-type semiconductor region 201 (second semiconductor region of second conductivity type).

A P-type semiconductor region 203 is provided on a surface of the N-type semiconductor region 202. The P-type semiconductor region 203 is provided in order to structure the photoelectric conversion portion into a buried photodiode. The P-type semiconductor region 203 reduces the effects of an interface state and suppresses the generation of dark currents on a surface of the photoelectric conversion portion. The photoelectric conversion portion includes at least the first semiconductor region and the second semiconductor region forming a PN junction in conjunction with the first semiconductor region.

A first transfer electrode 204 constitutes a first transfer portion. With a voltage to be supplied to the first transfer electrode, it is possible to control a potential state between the carrier holding portion and the charge-to-voltage converting portion (later-described fourth semiconductor region). The first transfer electrode is disposed on a first path between a later-described third semiconductor region and the fourth semiconductor region through an insulating film.

An N-type semiconductor region (third semiconductor region of first conductivity type) 205 constitutes part of the carrier accumulating portion. The N-type semiconductor region 205 is configured to be capable of accumulating carriers transferred from the photoelectric conversion portion for a certain period. A control electrode 206 is disposed on the third semiconductor region through an insulating film. The control electrode 206 can control the potential state of an area of the third semiconductor region near a boundary with the insulating film. By supplying a voltage to the control electrode 206 during a period of retaining carriers in the carrier holding portion, it is possible to reduce the effects of a dark current generated near a boundary with the surface oxide film of the N-type semiconductor region 205. As will be described later, the voltage supplied at this time is preferably a negative voltage since holes need to be collected at a boundary between the third semiconductor region and the insulating film. Thus, a voltage of, for example, approximately −3 V is supplied. This voltage is changed as appropriate, according to the impurity concentration of the third semiconductor region.

The carrier holding portion 102 of FIG. 3 includes the N-type semiconductor region 205 and the control electrode 206.

A second transfer electrode 207 constitutes a second transfer portion 105. The second transfer electrode 207 can control the potential state of a second path between the photoelectric conversion portion and the carrier holding portion.

A floating diffusion region (FD region) 208 functions as a charge-to-voltage converting portion. The floating diffusion region 208 is electrically connected to the gate of the amplifying MOS transistor through a plug 209 and the like.

A lightproof film 210 is arranged so that incident light does not enter the carrier accumulating portion. The lightproof film 210 is required to cover at least the carrier holding portion 102. It is preferable, however, for the lightproof film 210 to be arranged so as to extend across the entirety of the second transfer electrode as far as to the upper portion of a part of the first transfer electrode, as shown in the figure. This is because the light-shielding function of the film is enhanced.

A carrier discharge control electrode 211 can control the potential state of a third path between the photoelectric conversion portion and an OFD region. The carrier discharge control electrode is disposed on the third path through an insulating film. The control electrode 211 controls the potential state so that carriers generated in the photoelectric conversion portion by incident light can be discharged to the OFD region. With a voltage supplied to the control electrode 211, it is possible to control the length of an accumulating period (exposure period) at the photoelectric conversion portion.

Reference numeral 212 denotes an OFD region (fifth semiconductor region). A plug 213 is provided in order to supply a power supply voltage to the OFD region.

The unit pixel illustrated in FIGS. 3 and 4 is arranged in plurality, preferably in a two-dimensional manner, to constitute a solid-state imaging apparatus. The reset portion, amplifying portion, selection portion and the like of each pixel can be shared by a plurality of photoelectric conversion portions.

Figure 5:
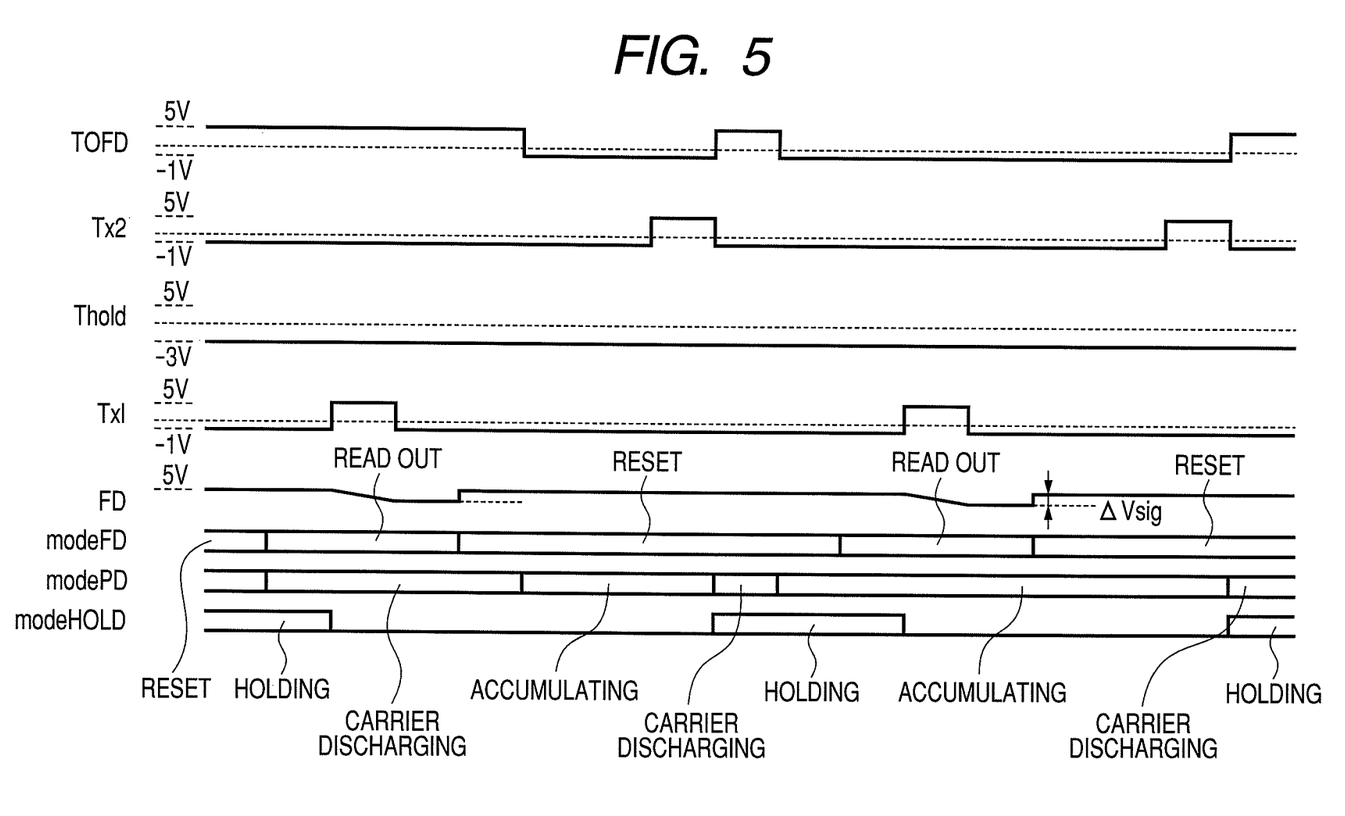
FIG. 5 is a schematic view of driving pulses according to the first embodiment.

FIG. 5 illustrates one example of driving pluses of the solid-state imaging apparatus illustrated in FIGS. 3 and 4. Here, only the driving pulses directly related to the characteristic features of the present embodiment will be described. Concrete details on the driving pulses of the above-described resetting MOS transistor and selecting MOS transistor will therefore be excluded from the description.

In FIG. 5, a driving pulse TOFD is supplied to a carrier discharge control electrode 211. A driving pulse Tx1 is supplied to a first transfer electrode 204. A driving pulse Tx2 is supplied to a second transfer electrode 207. A driving pulse Thold is supplied to the control electrode 206 of a carrier holding portion. An FD potential shows one example of the potential variation of an FD region. The amount of potential variation differs depending on the amount of carriers to be transferred.

Reference symbol modeFD shows the driving state of the FD region. A reset period refers to a state in which a reference voltage is supplied from a reset portion to the FD region. Note however that the reference voltage need not be supplied during the overall reset period. Alternatively, the reference voltage may be supplied at least immediately before carriers from the carrier holding portion are transferred. A read-out period refers to a state in which carriers are transferred to the FD region and a signal is read out by a selection portion. Accordingly, the read-out period is a period in which carriers transferred from the carrier holding portion exist in the FD region.

Reference symbol modePD shows the driving state of the photoelectric conversion portion. A carrier-discharging period refers to a state in which the carriers of the photoelectric conversion portion are discharged to the OFD region. Note that the carriers need not be discharged during the overall carrier-discharging period. Alternatively, the carriers may be discharged at least immediately before an accumulating period. Here, the accumulating period refers to a period in which carriers are accumulated in the photoelectric conversion portion. In the accumulating period, the transfer of carriers from the carrier accumulating portion to the OFD region is inhibited. That is, the second transfer portion is in a non-conducting state.

Then, at the end of this state of accumulation, the carriers of the photoelectric conversion portion are transferred to the carrier holding portion by the second transfer portion. In the case of global electronic shutter operation in which an accumulation time is synchronized across an entire imaging area, transfer operation undertaken by the second transfer portion is performed for all pixels at a time at the end of an accumulating period. Also in the case of global electronic shutter operation, a carrier-discharging period must be ended (an accumulating period must be started) for all pixels at a time.

Reference symbol modeHOLD shows the driving state of the carrier accumulating portion. A holding period is a period during which carriers transferred from the photoelectric conversion portion are retained. The carriers of the photoelectric conversion portions of all pixels are transferred to the carrier holding portion by the second transfer portion, and then transferred in line-by-line sequence to the FD region by the first transfer portion. A period between transfer by the second transfer portion and transfer by the first transfer portion corresponds to a holding period at the carrier accumulating portion.

Next, pulses supplied to respective transfer electrodes and control electrodes in FIG. 5 will be described. A characteristic feature of the present embodiment is that a voltage to be supplied to the control electrode of the carrier holding portion during a holding period at the carrier holding portion is a negative voltage. Another characteristic feature is that the absolute value of a first negative voltage to be supplied to the control electrode of the carrier holding portion during the holding period is larger than the absolute value of a second negative voltage to be supplied during the non-conducting period of the first transfer electrode. More generally speaking, the first voltage to be supplied during the non-conducting period of the first transfer portion is opposite in polarity to a voltage to be supplied during the turning on period of the first transfer portion. In addition, a second voltage to be supplied to the control electrode during the accumulating period of the carrier holding portion is the same in polarity as the first voltage and is larger in absolute value than the first voltage.

The first and second voltages are supplied by a voltage supply portion including the vertical scanning circuit of FIG. 1. During the non-conducting period of the first transfer portion, the voltage supply portion supplies a first voltage opposite in polarity to a voltage supplied during the turning on period of the first transfer portion, to the first transfer electrode. The first voltage is supplied through the drive control interconnect of FIG. 1. In addition, the voltage supply portion is configured so as to supply a second voltage, the same in polarity as the first voltage and larger in absolute value than the first voltage, to the control electrode of the carrier holding portion during the accumulating period of the carrier holding portion.

Here, a description will be made of a magnitude relation between a voltage applied during the non-conducting period of the first transfer electrode and a voltage supplied during the holding period of the control electrode of the carrier holding portion.

The control electrode of the carrier holding portion is disposed in the upper portion of an N-type semiconductor region 205. In order to enhance the function of accumulating signal carriers, the impurity concentration of the N-type semiconductor region 205 needs to be increased. As the impurity concentration becomes higher, an even more negative voltage is required to suppress a dark current.

In addition, the voltage supplied to the first transfer electrode during a non-conducting period is often 0 V in the case of an NMOS transistor. This is because the NMOS transistor is used at a power supply voltage of 0 to 3.3 V or 0 to 5 V in a regular IC. If the voltage is 0 V, it is not possible to sufficiently suppress the effects of a dark current generated from a channel portion underneath the transfer electrode. Accordingly, a negative voltage is supplied during the non-conducting period of each transfer electrode to collect holes at the channel portion, thereby suppressing the dark current (see Patent Document 1). For the above-described reason, it is conceivable that the voltage values of the control electrode of the carrier holding portion and the first transfer electrode during a non-conducting period are made equal to each other, for example, −3 V. With such a magnitude relation, it is possible to suppress both the dark current underneath the first transfer electrode and a dark current in the carrier holding portion. However, using such a voltage may cause a large electric field to be applied between the first transfer electrode and the FD region. Consequently, the withstand voltage performance of a gate-drain oxide film may degrade. Specifically, assume that a voltage of, for example, −3 V is supplied to the first transfer electrode as with the carrier holding portion. Then, the drain, i.e., the FD region, of an MOS transistor including the first transfer electrode is in a state of being supplied with a reference voltage by a reset portion after the signal carriers of a previous frame are read out. This reference voltage is, for example, 5 V. In consequence, a voltage of 8 V is applied to an edge of the FD region on the first transfer electrode side, thus degrading the withstand voltage performance. Alternatively, restrictions are placed on the value of a voltage to be applied to the FD region, or on a driving timing, in order to avoid such a state of voltage application.

On the other hand, a reference voltage (for example, 5 V) is supplied from the reset portion to the N-type semiconductor region 205 constituting the carrier holding portion during a reset period. However, only a voltage of approximately −3 V at the highest is applied to the oxide film on the N-type semiconductor region. This is because holes are collected at the surface of the N-type semiconductor region and these holes are at the same potential of 0 V as a substrate. Furthermore, in a location where a collection of holes interrupts partially, the N-type semiconductor region is completely depleted before the reference voltage is reached. Thus, the N-type semiconductor region does not reach the reference voltage. In addition, carriers from the photoelectric conversion portion are transferred to the N-type semiconductor region in an accumulating period, thus placing the potential of the region in a state of being further lowered from the voltage at the time of depletion.

Accordingly, such a large electric field as that of the first transfer portion is not applied to the N-type semiconductor region even if the potential of the N-type semiconductor region is made higher to the negative side than a negative voltage supplied during the non-conducting period of the first transfer portion. Consequently, by setting a voltage to be supplied to the control electrode of the carrier holding portion during an accumulating period higher to the negative side than a voltage to be supplied at the non-conducting period of the first transfer electrode, it is possible to achieve both the suppression of dark currents and the maintenance of the withstand voltage of the first transfer portion.

Next, specific driving pulses will be described. The transfer portion and the carrier discharge controlling portion turn on (ON state) with a High pulse and turn off (OFF state) with a Low pulse. The voltages of TOFD, Tx1 and Tx2 are 5 V during a turning on period and −1 V during a non-conducting period. The voltage of Thold is −3 V during a carrier-holding period.

First, as an initial state of FIG. 5, the FD region is in a reset period, the photoelectric conversion portion is in a carrier-discharging period, and the carrier holding portion is in a carrier-holding period. At this time, TOFD is in a conducting state, in which carriers from the photoelectric conversion portion are discharged to the OFD region. In this state, all of carriers generated by photoelectric conversion are discharged to the OFD region, while light is entering the photoelectric conversion portion. At this time, the carrier holding portion retains signal carriers transferred from the photoelectric conversion portion in a previous frame.

Next, a first voltage is supplied to the first transfer electrode in order to place the first transfer portion in a conducting state, and carriers retained by the carrier holding portion are transferred to the FD region. This operation brings an end to the carrier-holding period of the carrier accumulating portion. In addition, the reset period of the FD region also ends a predetermined time before the first voltage is supplied to the first transfer electrode.

Next, a signal based on the carriers transferred to the FD region is read out. This read-out period is a period of reading the FD region. The potential of FD lowers by as much as a potential corresponding to the amount of carriers transferred from the carrier holding portion, from a reference voltage supplied by the reset portion, as illustrated in the figure. That is, the signal carriers are converted into a voltage in the FD region. Under this condition, current supply to an amplifying transistor is controlled by a selection portion and the signal is read out by means of source-follower operation. This is the operation of the FD region in the read-out period thereof.

After the end of the read-out period, the reference voltage is supplied to the FD region by the reset portion, thereby setting the potential of the FD region to a reference potential. Consequently, the FD region once again enters a reset period.

Next, a voltage lower than a voltage applied in a conducting state is supplied to TOFD in order to place the carrier discharge controlling portion in a non-conducting state. Consequently, the photoelectric conversion portion makes a transition from a carrier-discharging period to a carrier-accumulating period. In the carrier-accumulating period, a second voltage, for example, −3 V is supplied to the control electrode of the carrier accumulating portion as Thold, and a first voltage, for example, −1 V is supplied to Tx1.

Next, a voltage higher than a voltage applied in a non-conducting state is supplied to TX2 during an accumulating period at the photoelectric conversion portion, in order to place the second transfer portion in a conducting state. The second transfer portion thus goes into a conducting state, and the carriers of the photoelectric conversion portion are transferred to the carrier accumulating portion. Consequently, the carrier-accumulating period at the photoelectric conversion portion ends. After this, a voltage higher than one applied in a non-conducting state is supplied to TOFD, thereby placing the photoelectric conversion portion in a carrier-discharging state. In addition, the carrier holding portion goes into a carrier-holding state. At this time, the first transfer portion is in a non-conducting state. A voltage (first voltage) supplied to the first transfer electrode during this non-conducting period is −1 V, and a voltage (second voltage) supplied to the control electrode of the carrier holding portion is −3 V. That is, the second voltage is the same in polarity as the first voltage and is larger in absolute value than the first voltage. By correlating the voltages in this way, it is possible to reduce dark currents mixing into the carrier holding portion and maintain the withstand voltage of the first transfer portion.

Next, a voltage lower than one applied in a conducting state is supplied to TOFD according to a preset exposure time, in order to place the carrier discharge controlling portion in a non-conducting state. Consequently, the carrier-discharging state of the photoelectric conversion portion ends, and the photoelectric conversion portion makes a transition to a carrier-accumulating state.

Next, such a voltage as to place the second transfer portion in a conducting state is supplied to TX2. Consequently, the carrier-accumulating period of the photoelectric conversion portion ends. The potential of the FD region varies according to the amount of carriers retained in the carrier holding portion. A signal according to this potential variation is read out by a source-follower circuit.

Imaging is carried out by continuously performing such scanning as described above. In the present embodiment, a description has been made of reading from pixels of one pixel line. If the solid-state imaging apparatus has a plurality of pixel lines, the first transfer portion and the carrier discharge controlling portion are controlled, so that a carrier-accumulating period at the photoelectric conversion portion is synchronized for all pixels. Then, global electronic shutter operation can be carried out by sequentially performing carrier transfer from the carrier holding portion to the FD region for each pixel line. Alternatively, transfer from the photoelectric conversion portion to the carrier holding portion may be performed in line-by-line sequence, without carrying out global electronic shutter operation.

In addition, it is possible to set a carrier-accumulating time at the photoelectric conversion portion, as appropriate, by controlling the first transfer portion and the carrier discharge controlling portion.

In the present embodiment, it is possible to suppress the mixing-in of dark currents by supplying a negative voltage to the control electrode of the carrier holding portion during a carrier-accumulating period at the carrier holding portion. In addition, a negative voltage lower than a voltage supplied during the carrier-holding period of the carrier holding portion is supplied as a voltage to be supplied at the non-conducting period of the first transfer electrode. Consequently, it is possible to achieve both the suppression of the mixing-in of dark currents at the carrier accumulating portion and the maintenance of the withstand voltage of the first transfer portion.

In addition, according to the present embodiment, it is possible to overlap at least part of a period in which the reference voltage to be supplied to the fourth semiconductor region by the reset portion is supplied and part of a period in which the second voltage to be applied at a non-conducting period is supplied to the transfer electrode. In other words, it is possible to increase the freedom of setting the driving timing of the reset portion.

(Second Embodiment)

Figure 6:
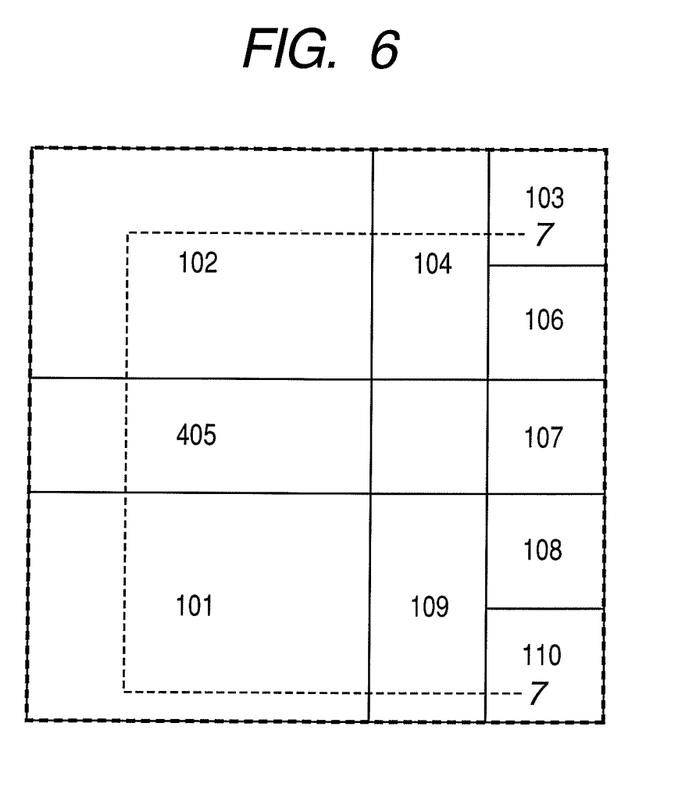
FIG. 6 is a plan view of a solid-state imaging apparatus according to a second embodiment.
Figure 7:
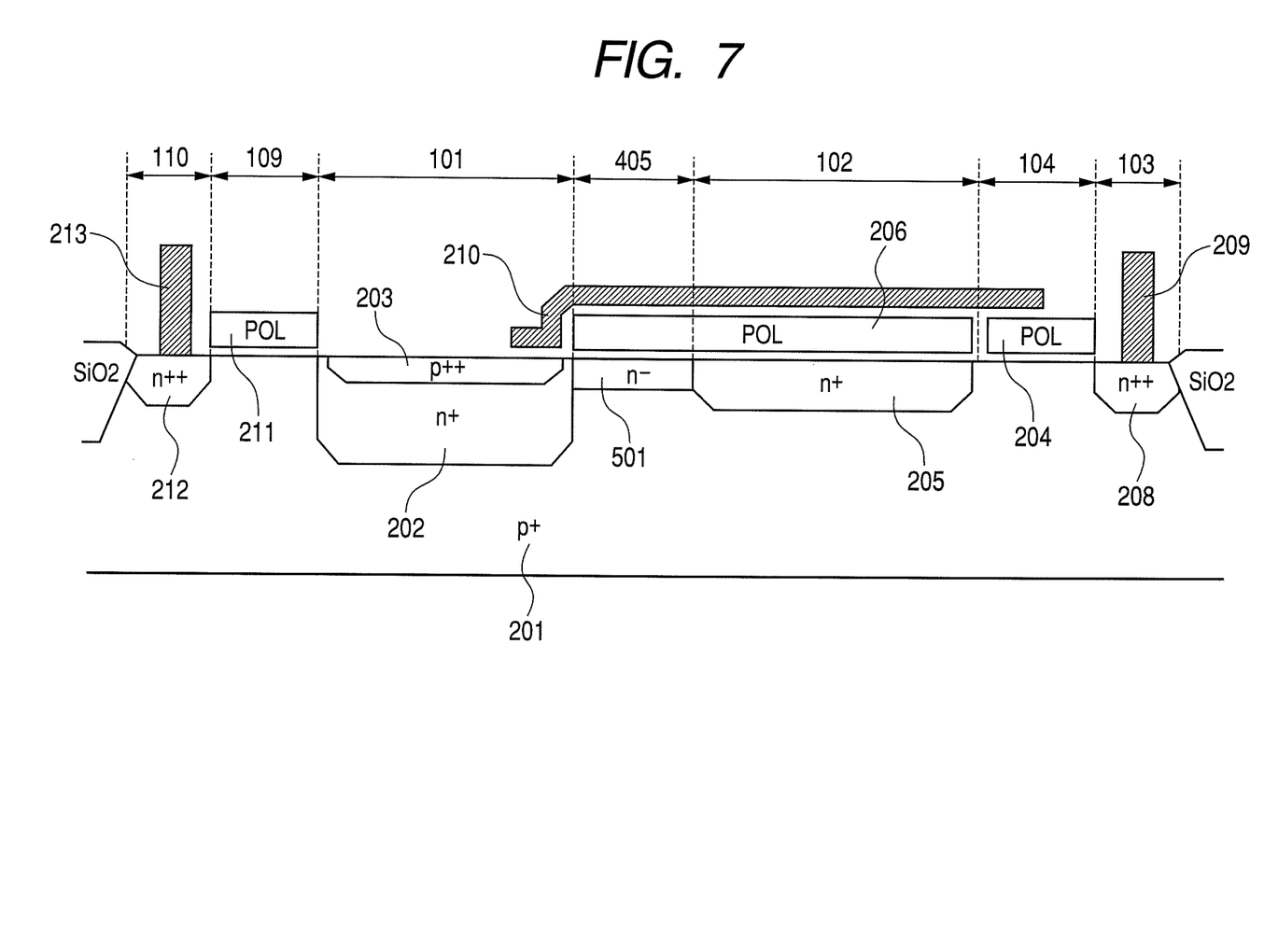
FIG. 7 is a cross-sectional view taken along the line 7-7 in FIG. 6.
Figure 8:
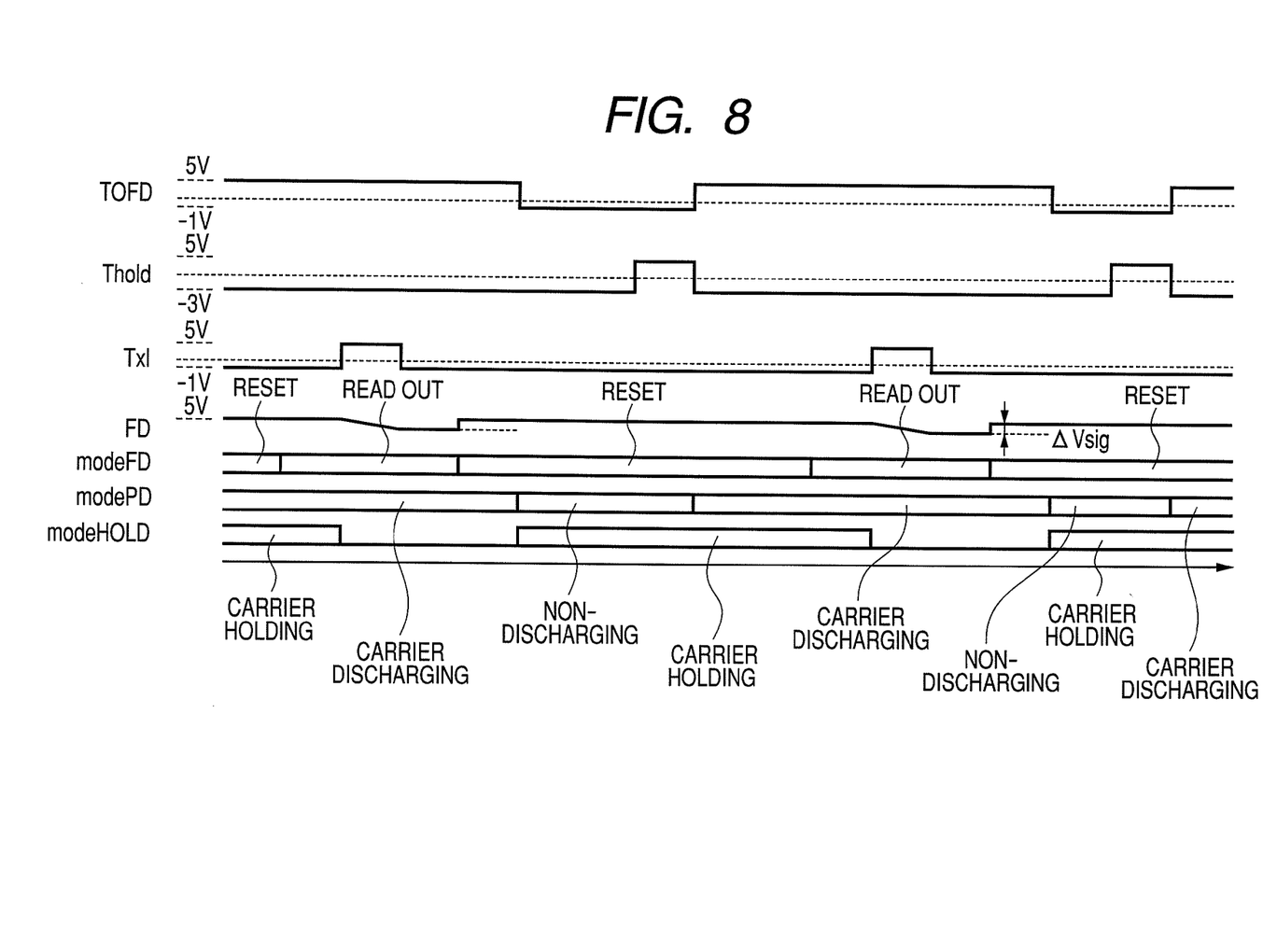
FIG. 8 is a schematic view of driving pulses according to the second embodiment.

FIG. 6 is a plan view of a solid-state imaging apparatus of the present embodiment, FIG. 7 is a cross-sectional view taken along the line 7-7 in FIG. 6, and FIG. 8 is a schematic view of driving pulses. Constituent elements having the same functions as those of the first embodiment are denoted by like reference numerals and will not be described in any more detail.

The present embodiment differs from the first embodiment in the structure of a path between the photoelectric conversion portion and the carrier holding portion. The path is structured so that carriers can be transferred from the photoelectric conversion portion to the carrier holding portion under the condition in which a voltage whereby the first transfer portion is placed in a non-conducting state is supplied. Specific examples of the structure include a buried channel structure provided underneath the second transfer electrode. In this structure, there exists a portion at a location deeper than a surface only where an energy barrier is partially low even in a non-conducting state.

According to such a configuration as described above, most of signal carriers generated by photoelectric conversion when light enters the photoelectric conversion portion can be transferred to the carrier holding portion without letting the carriers accumulate in the photoelectric conversion portion. Consequently, a carrier-accumulating period can be synchronized for all photoelectric conversion portions contained in pixels. In addition, since holes are accumulated in a surface during a non-conducting period and a channel to which carriers are transferred exists at a predetermined depth from the surface, it is possible to reduce the effects of a dark current in a boundary with an insulating film.

In another respect, the potential of a path (second path) between the photoelectric conversion portion and the carrier holding portion is lower than the potential of a path (third path) between the photoelectric conversion portion and the OFD region in a period in which signal carriers are accumulated in the photoelectric conversion portion and the carrier accumulating portion. The potential referred to here is one as against a signal carrier.

In addition, from the viewpoint of driving, carriers are retained in the carrier holding portion during one accumulating period and a signal retained in the carrier holding portion is used as an image. In other words, the signal is read out of a pixel after the start of one accumulating period at the photoelectric conversion portion, without going through the operation of resetting the carrier holding portion. Note that one accumulating period is a period determined for the respective photoelectric conversion portions in common when a one-frame image is taken. Thus, the period can also be said to be the exposure time of each frame.

In FIGS. 6 and 7, reference numeral 104 denotes a first transfer portion. A low-concentration N-type semiconductor region 501 enables a channel to be formed in a region at a predetermined depth from a boundary with an insulating film. In addition, the solid-state imaging apparatus has a structure in which the transfer electrode constituting the second transfer portion is made common to the control electrode of the carrier holding portion. A voltage or the impurity concentration and position of a path is set so that a region, the potential of which is lower than that of electrons (buried channel), is formed in a region at a predetermined depth from a boundary with the insulating film even if a negative voltage is supplied to the common electrode. Through this channel, carriers are transferred from the photoelectric conversion portion to the carrier holding portion. That is, the solid-state imaging apparatus is configured so that the carriers of the photoelectric conversion portion are transferred to the carrier holding portion by adjusting the voltage of the carrier-discharging control electrode, even if a non-conducting driving pulse is supplied to the second transfer electrode.

Next, a description will be made of the schematic view of driving pulses illustrated in FIG. 8. Also in the present embodiment, the substantial parts of the driving pulses are the same as those of the first embodiment. In a carrier-holding period at the carrier accumulating portion, a voltage supplied to the above-described common electrode is lower (higher to the negative side) than a voltage supplied during the non-conducting period of the first transfer electrode. By supplying such a driving pulse as described above, it is possible to suppress the mixing-in of dark currents at the carrier holding portion, and maintain the withstand voltage of the first transfer portion.

The present embodiment differs from the first embodiment in that in a carrier-holding period at the carrier accumulating portion, the carrier discharge controlling portion must always be placed in a conducting state, in order to maintain the photoelectric conversion portion in a carrier-discharging state. This carrier-discharging state is cancelled at any point in time after the first transfer electrode goes into a conducting state and the carriers of the carrier holding portion are transferred to the FD region. The reason for this is that as described above, the solid-state imaging apparatus is configured so that carriers can be transferred from the photoelectric conversion portion to the carrier holding portion even in the non-conducting state of the second transfer portion. That is, carriers from the photoelectric conversion portion flow into the carrier holding portion even in a state of waiting carrier transfer to the FD region after the completion of carrier transfer to the carrier holding portion. Under such a condition, the amount of carriers flowing in from the photoelectric conversion portion varies depending on the length of a holding period at the carrier holding portion, thus causing difficulty in performing precise signal read-out. Accordingly, the carriers of the photoelectric conversion portion must be discharged by the carrier-discharging portion at least until carrier transfer from the carrier accumulating portion to the FD region is completed in all pixels.

In the first embodiment, carriers are accumulated in the photoelectric conversion portion and, therefore, this period of accumulation is defined as an accumulating period. In the present embodiment, however, most of photoelectrically-converted carriers are immediately transferred to the carrier holding portion. Consequently, a carrier-discharging period and a non-discharging period alternate with each other at the photoelectric conversion portion.

In the present embodiment, as is obvious from comparison between FIG. 3 and FIG. 6, an accumulating period at the carrier holding portion tends to be longer than that of the first embodiment. Accordingly, there is the possibility that effects of a dark current mixing in at the carrier holding portion also become even larger than those of the first embodiment. In such a case, there is obtained an even greater effect of suppressing the mixing-in of a dark current at the carrier accumulating portion by defining a voltage relationship as described above. In addition, it is possible to maintain the withstand voltage of the second transfer portion.

Although in the present embodiment, the gate electrode of the second transfer portion is made common to the gate electrode of the carrier holding portion, the present embodiment is not limited to this configuration. Whereas electrode sharing reduces the amount of driving interconnection and is, therefore, preferable from the viewpoint of improvement in an opening ratio, it is also possible to use separate electrodes and drive the electrodes separately. In addition, by placing the common electrode in a conducting state at the end of a non-discharging period at the photoelectric conversion portion for all pixels at a time, it is possible to use carriers remaining in the photoelectric conversion portion, though small in amount, as a signal. This is preferable from the viewpoint of linearity in a low-brightness domain.

Having thus described the present invention by referring to specific embodiments, the present invention is not limited to these embodiments. The embodiments may be modified or combined with each other without departing from the subject matter of the present invention. For example, although a description has been made in each embodiment assuming that the signal carrier is an electron, it is also possible to use a hole instead. In this case, the conductivity type of each semiconductor region changes to an opposite conductivity type, simply reversing the polarity of a voltage to be supplied. In the above-described embodiments, a negative voltage is supplied to each transfer gate electrode and carrier-holding gate electrode at a carrier-holding period when the electrodes are in a non-conducting state. Alternatively, the voltage may be changed to a positive voltage.

According to the present invention, it is possible to achieve both the reduction of the effects of a dark current and the maintenance of the withstand voltage of the carrier transfer portion in a configuration in which a pixel includes a carrier holding portion.

This application claims the benefit of Japanese Patent Application No. 2008-101531, filed Apr. 9, 2008, which is hereby incorporated by reference herein in its entirety.

The invention claimed is:

1. A driving method of a solid-state imaging apparatus including a plurality of pixels, each comprising:
   a photoelectric conversion portion;
   a carrier holding portion including a semiconductor region capable of accumulating signal carriers generated in the photoelectric conversion unit, and a control electrode arranged above the semiconductor region sandwiching an insulating film between the semiconductor region and the control electrode, such that the carrier holding unit holds the signal carriers generated in the photoelectric conversion portion;

an amplifying portion; and a transfer portion having a transfer electrode for controlling an electrical connection between an input portion of the amplifying portion and the carrier holding portion, wherein the driving method comprises steps of:

supplying the transfer electrode with a first voltage for turning off the electrical connection through the transfer portion, the first voltage being in a polarity opposite to a polarity of a voltage supplied to the transfer electrode during the turning on period of the transfer portion; and supplying the control electrode with a second voltage during a period of holding the carrier by the carrier holding portion, the second voltage being in the same polarity as the first voltage and being larger than the first voltage.

2. The driving method of a solid-state imaging apparatus according to claim 1, further comprising a reset portion for supplying a reference voltage to an input portion of the amplifying portion, such that a period of supplying the reference voltage to the input portion of the amplifying portion is at least partially overlapped with a period of supplying the second voltage to the transfer electrode at the turning off of the transfer portion.

3. A solid-state imaging apparatus including a plurality of pixels, each comprising:

a photoelectric conversion portion having a first semiconductor region of a first conductivity type and a second semiconductor region of a second conductivity type for forming PN junction with the first semiconductor region, for generating a par of a signal carrier and a carrier of a polarity opposite to that of the signal carrier according to an incident light;

a carrier holding portion including a third semiconductor region of the first conductivity type, and a control electrode arranged over the third semiconductor region sandwiching an insulating film between the control electrode arranged and the third semiconductor region for controlling a potential state as to the signal carrier in a region in the vicinity of an interface to the insulating film;

a fourth semiconductor region of the first conductivity type;

a first transfer portion having a first transfer electrode arranged over a first path between the third and fourth semiconductor regions sandwiching an insulating film between the first transfer electrode and the first path, and being capable of controlling a potential state as to the signal charge on the first path; and a reset portion for setting the fourth semiconductor region at a reference potential, wherein a voltage supply portion for supplying a voltage to the first transfer portion and to the control electrode is provided, the voltage supply portion supplies, during a period of non-conducting of the first transfer portion, to the first transfer electrode a first voltage of a polarity opposite to that of a voltage supplied during a period of turning on the first transfer portion, and the voltage supply portion supplies, during a period of an accumulation period of the charge holding portion, to the control electrode a second voltage of the same polarity as the first voltage and larger than the first voltage.

4. The solid-state imaging apparatus according to claim 3, further comprising a second transfer electrode arranged over a second path between the photoelectric conversion portion and the carrier holding portion sandwiching an insulating film between the second transfer electrode and the second path.

5. The solid-state imaging apparatus according to claim 4, wherein the second path between the photoelectric conversion portion and the carrier holding portion is a buried channel.

6. The solid-state imaging apparatus according to claim 4, further comprising a carrier discharging portion comprising a fifth semiconductor region of the first conductivity type, and a carrier discharging electrode arranged over a third path between the photoelectric conversion portion and the fifth semiconductor region sandwiching an insulating film between the carrier discharging electrode and the third path, and a potential as to the signal carrier on the second path is lower than a potential as to the signal carrier on the third path.

7. The solid-state imaging apparatus according to claim 5, further comprising the control electrode extends to the second path.

8. A solid-state imaging apparatus including a plurality of pixels, each comprising:

a photoelectric conversion portion having a first semiconductor region of a first conductivity type and a second semiconductor region of a second conductivity type for forming PN junction with the first semiconductor region, for generating a par of a signal carrier and a carrier of a polarity opposite to that of the signal carrier according to an incident light;

a carrier holding portion including a third semiconductor region of the first conductivity type, and a control electrode arranged over the third semiconductor region sandwiching an insulating film between the control electrode arranged and the third semiconductor region for controlling a potential state as to the signal carrier in a region in the vicinity of an interface to the insulating film;

a fourth semiconductor region of the first conductivity type;

a first transfer portion having a first transfer electrode arranged over a first path between the third and fourth semiconductor regions sandwiching an insulating film between the first transfer electrode and the first path, and being capable of controlling a potential state as to the signal charge on the first path; and a reset portion for setting the fourth semiconductor region at a reference potential, wherein a second transfer electrode is arranged over a second path between the photoelectric conversion portion and the carrier holding portion sandwiching an insulating film between the second transfer electrode and the second path, a carrier discharging portion is provides and comprises a fifth semiconductor region of the first conductivity type, and a carrier discharging electrode arranged over a third path between the photoelectric conversion portion and the fifth semiconductor region sandwiching an insulating film between the carrier discharging electrode and the third path, a voltage supply portion for supplying a voltage to the first transfer portion and to the control electrode is provided, the voltage supply portion supplies, during a period of non-conducting of the first transfer portion, to the first transfer electrode a first voltage of a polarity opposite to that of a voltage supplied during a period of turning on the first transfer portion, the voltage supply portion supplies, during a period of an accumulation period of the charge holding portion, to the control electrode a second voltage of the same polarity as the first voltage and larger than the first voltage, the second path between the photoelectric conversion portion and the carrier holding portion is a buried channel, and a potential as to the signal carrier on the second path is lower than a potential as to the signal carrier on the third path.

* * * * *